United States Patent
Toyoda et al.

(10) Patent No.: US 8,281,207 B2
(45) Date of Patent: Oct. 2, 2012

(54) DATA TRANSMISSION EQUIPMENT AND GENERATING METHOD FOR TRANSMISSION CODE

(75) Inventors: Hidehiro Toyoda, Tachikawa (JP); Takayuki Muranaka, Kawasaki (JP); Takeshi Matsumoto, Tama (JP); Naohisa Koie, Yokohama (JP)

(73) Assignee: Alaxala Networks Corporation, Kanagawa (JP)

( * ) Notice: Subject to any disclaimer, the term of this patent is extended or adjusted under 35 U.S.C. 154(b) by 722 days.

(21) Appl. No.: 12/515,176

(22) PCT Filed: Nov. 17, 2006

(86) PCT No.: PCT/JP2006/322998
§ 371 (c)(1),
(2), (4) Date: May 15, 2009

(87) PCT Pub. No.: WO2008/059588
PCT Pub. Date: May 22, 2008

(65) Prior Publication Data
US 2009/0276683 A1 Nov. 5, 2009

(51) Int. Cl.
*H03M 13/00* (2006.01)
(52) U.S. Cl. ............... 714/752; 714/710; 714/758
(58) Field of Classification Search ......... 714/710, 714/752, 758
See application file for complete search history.

(56) References Cited

U.S. PATENT DOCUMENTS

| | | | |
|---|---|---|---|
| 4,486,739 A | 12/1984 | Franaszek et al. | |
| 5,574,448 A | 11/1996 | Weng et al. | |
| 2002/0049933 A1 | 4/2002 | Nyu | |
| 2003/0135798 A1* | 7/2003 | Katayama et al. | 714/710 |
| 2003/0204806 A1* | 10/2003 | Hisada et al. | 714/758 |

FOREIGN PATENT DOCUMENTS

| | | |
|---|---|---|
| JP | 59-10056 A | 1/1984 |
| JP | 10-503355 A | 3/1998 |
| JP | 2002-135359 A | 5/2002 |
| JP | 2003-6986 A | 1/2003 |
| JP | 2005-64888 A | 3/2005 |
| JP | 2006-211384 A | 8/2006 |

* cited by examiner

*Primary Examiner* — Sam Rizk
(74) *Attorney, Agent, or Firm* — Mattingly & Malur, PC

(57) ABSTRACT

A transmitter communicates with a receiver and an error corrector corrects bit errors generated during data transmission. The transmitter has a scrambler unit that scrambles data so that a running disparity of 0 and 1 in the input data is substantially zero. A bit-string converting unit 15 that adds bit data for ensuring a maximum run length of a serial bit string of the scrambled data and converts control information to bit data of a fixed value. A synchronization timing generating unit 16 divides the transmitted data by a constant interval and converts the transmission data to a data block. A bit-string converting unit extracts a fixed-value bit pattern of the control data from the bit string of the data block, converts the bit pattern to the control information, and discriminates the data and the control information. A descrambler unit reconverts the data-scrambled data to the data before scrambling.

6 Claims, 4 Drawing Sheets

BYTE TRANSFER ORDER

| | 5 | 4 | 3 | 2 | 1 | 0 | T |
|---|---|---|---|---|---|---|---|
| BIT TRANSFER ORDER | a5 | a4 | a3 | a2 | a1 | a0 | |
| | b5 | b4 | b3 | b2 | b1 | b0 | |
| | c5 | c4 | c3 | c2 | c1 | c0 | 45 |
| | d5 | d4 | d3 | d2 | d1 | d0 | |
| | e5 | e4 | e3 | e2 | e1 | e0 | |
| | f5 | f4 | f3 | f2 | f1 | f0 | |
| | g5 | g4 | g3 | g2 | g1 | g0 | |
| | h5 | h4 | h3 | h2 | h1 | h0 | |
| | i5 | i4 | i3 | i2 | i1 | i0 | |
| | j5 | j4 | j3 | j2 | j1 | j0 | |

DATA TRANSMISSION EQUIPMENT AND GENERATING METHOD FOR TRANSMISSION CODE

TECHNICAL FIELD

The present invention relates to a transmitter and a receiver which transmit data through a data communication path, and more particularly relates to an error corrector which corrects bit errors generated during data transmission and to an encoder/decoder unit which improve characteristics on the transmission path.

BACKGROUND ART

For example, a technique using an 8B10B line code/transmission code is present as the data transmission technique using communication interfaces or high-speed serial interfaces for network equipment, personal computers, etc. (see Patent Document 1).

In this technique, when serial data having an undetermined running disparity and run length of 0s and 1s input, the data is divided in 8-bit intervals, the running disparity of 0s and 1s is caused to be even in a comparatively short bit interval (several tens of bits), and a maximum run length is ensured to five at a maximum.

In the case of this data transmission technique, DC balance can be ensured by causing the running disparity of 0s and 1s to be even. Moreover, deterioration of the signal quality on a transmission path can be suppressed by ensuring that a run length of bits is a finite number (ensure limited/finite run length).

Patent Document 1: U.S. Pat. No. 4,486,739

DISCLOSURE OF THE INVENTION

Technical Problem

However, the present inventors have found out that the above-described data transmission technique by the 8B10B transmission code has problems such as the following.

The 8B10B code in the above-described Patent Document 1 is not equipped with an error correction function. Recent high-speed serial transmission is remarkably influenced by extrinsic noise. Therefore, in the transmitter/receiver equipped with the 8B10B code, if a bit error is generated due to a cause such as noise contamination with respect to a transmission path, merely the generation of the error can be detected from a result such as a running disparity error or a decoding error (original data corresponding to a received bit string is not present) when 8B10B decoding is carried out on the receiving side.

In the above-described case, the received data including the error has to be discarded, and the transmitting side is necessary to be requested by a different means to transmit the same data again. Alternatively, error correction is necessary to be carried out on the receiving side by further encoding the transmitted data, which is encoded by the 8B10B code, by an error correction code.

In either case, since a larger communication band is required for a simple bit error, there has been a problem that the code rate (the ratio of the originally transmitted data volume and the data volume actually transmitted to the transmission path) is lowered.

It is an object of the present invention to provide techniques not only ensuring the DC balance and limited/finite run length, which are original functions of the transmission code, in data transmission using a high-speed serial interface, but also realizing a bit correction function while maintaining the same code rate as the 8B10B code, which is one transmission encoding method.

The above and other objects and novel characteristics of the present invention will be apparent from the description of the present specification and the accompanying drawings.

Solution to Problem

The typical ones of the inventions disclosed in the present application will be briefly described as follows.

The present invention includes data transmission equipment converting transmission data, which is composed of data and control information, to serial bit string data and transmitting the converted data, the data transmission equipment comprising a transmitter and a receiver connected by a transmission path, wherein the transmitter includes: a scrambler unit which ensures DC balance by scrambling data so that a running disparity of 0s and 1s of input data is substantially zero; a bit-string converting unit which adds bit data, which ensures a maximum run length of a serial bit string of the scrambled data, to the data and converts control information to bit data of a certain fixed value; a synchronization timing generating unit which divides transmission data by a constant interval and converts the transmission data to a data block; and a check-bit calculating and adding unit which calculates check data for an error correction with respect to the data block and adds the check data to part of the data block, and the receiver includes: an error-bit calculating/correcting unit which receives the data block, carries out an error check and an error correction based on the check bits added to the data block; a bit-string converting unit which extracts a fixed-value bit pattern of the control data from the bit string of the data block, converts the bit pattern to the control information, and discriminates the data and the control information; and a descrambler unit which reconverts the data-scrambled data to the data before scrambling.

In addition, in the present invention, the transmission data to be input to the transmitter includes an 8-bit bit data string (bits A, B, C, D, E, F, G, and H) and a control bit (bit K) indicating that the 8-bit data is either data or control information; if the transmission data is data, the scrambler unit scrambles the data so that the running disparity of 0s and 1s of the 8-bit bit data string (bits A, B, C, D, E, F, G, and H) is even or substantially even and obtains the result as an 8-bit bit pattern (bits a, b, c, d, f, g, h, and j); the bit-string converting unit adds: a value of 1 if the number of bits whose value is 1 is 0 to 3 in the 8-bit bit pattern (bits a, b, c, d, f, g, h, and j); a value of 0 if the number is 5 to 8; and 1-bit data (bit e) that indicates an inverted value of an immediately previous bit (bit d or f) in a serial bit string if the number is 4 so as to convert to a 9-bit bit pattern (bits a, b, c, d, e, f, g, h, and j), thereby ensuring the DC balance and the maximum run length of ensured contiguous bit data; and, if the input data is control data, the bit-string converting unit converts to a 10-bit fixed bit pattern (bits a, b, c, d, e, i, f, g, h, and j) corresponding to the value represented by the 8-bit data string, thereby ensuring the DC balance and the maximum run length of the contiguous bit data.

Further, in the present invention, with taking a combination of six contiguous bit patterns as one code block (bits a0-a5, b0-b5, c0-c5, d0-d5, e0-e5, f0-f5, g0-g5, h0-h5, i0-i5, and j0-j5) for the 9-bit bit pattern (bits a, b, c, d, e, f, g, h, and j) converted from the data and a 9-bit fixed bit pattern obtained by removing 1 bit from the 10-bit fixed bit pattern (bits a, b, c, d, e, i, f, g, h, and j) converted from the control information, the check-bit calculating and adding unit generates a 6-bit check word based on an information word composed of the 54-bit bit patterns constituting the block and outputs a 60-bit code block in which contiguous six bits i (bits i0 to i5) are added; the error-bit calculating unit receives the code block and carries out an error detection based on the 54-bit information word and the 6-bit check word; and the error-bit correcting unit corrects the error detected by the error-bit calculating unit.

Also, in the present invention, the transmission data to be input to the transmitter is composed of an 8-bit bit data string (bits A, B, C, D, E, F, G, and H) and a control bit (bit K) indicating that the 8-bit data is either data or control information; the scrambler unit converts, if the transmission data is control information, the transmission data to a 10-bit fixed bit pattern (bits a, b, c, d, e, i, f, g, h, and j) corresponding to the value indicated by the 8-bit data string, thereby ensuring the DC balance and the maximum run length of contiguous bit data, and the scrambler unit, if the transmission data is data, scrambles the data so that the running disparity of 0s and 1s of the 8-bit data string (bits A, B, C, D, E, F, G, and H) is even or substantially even and obtains the result as an 8-bit bit pattern (bits a, b, c, d, f, g, h, and j); if the 8-bit bit pattern (bits a, b, c, d, f, g, h, and j) which is the result of scrambling has the same value as the 8 bits (bits a, b, c, d, f, g, h, and j) of the 10-bit fixed bit pattern which is obtained upon conversion in the case of control information, the bit-string converting unit takes the value of a remaining bit (bit e) as an inverted value of a bit (bit e) of the 10-bit fixed bit pattern, and, if the 8-bit bit pattern (bits a, b, c, d, f, g, h, and j) which is the result of scrambling does not have the same value as the 8 bits (bits a, b, c, d, f, g, h, and j) of the 10-bit fixed bit pattern which is obtained upon conversion in the case of the control information, the bit-string converting unit adds: a value of 1 if the number of bits whose value is 1 is 0 to 3 in the 8-bit bit pattern (bits a, b, c, d, f, g, h, and j); a value of 0 if the number is 5 to 8; and 1-bit data (bit e) that indicates an inverted value of an immediately previous bit (bit d or f) in a serial bit string if the number is 4 so as to convert to a 9-bit bit pattern (bits a, b, c, d, e, f, g, h, and j), thereby ensuring the DC balance, the maximum run length of ensured contiguous bit data, and decoding.

Further, the present invention is a generating method for a transmission code for converting transmission data to serial bit string data and transmitting the same by a transmitter and a receiver connected by a transmission path, wherein the transmission data to be input to the transmitter is composed of an 8-bit bit data string (bits A, B, C, D, E, F, G, and H) and a control bit (bit K) indicating whether the 8-bit data is normal data or control data; if the input data is the data, the data is scrambled so that the running disparity of 0s and 1s of the 8-bit bit data string (bits A, B, C, D, E, F, G, and H) is even or substantially even and the result is obtained as an 8-bit bit pattern (bits a, b, c, d, f, g, h, and j), and, a value of 1 is added if the number of bits whose value is 1 is 0 to 3 in the 8-bit bit pattern (bits a, b, c, d, f, g, h, and j); a value of 0 is added if the number is 5 to 8; and 1-bit data (bit e) that indicates an inverted value of an immediately previous bit (bit d or f) in a serial bit string is added if the number is 4 so as to convert to a 9-bit bit pattern (bits a, b, c, d, e, f, g, h, and j), thereby ensuring the DC balance and the maximum run length of ensured contiguous bit data; and, if the input data is control data, the bit-string converting unit converts to a 10-bit fixed bit pattern (bits a, b, c, d, e, i, f, g, h, and j) corresponding to the value represented by the 8-bit data string, thereby ensuring the DC balance and the maximum run length of the contiguous bit data.

Also, in the present invention, with taking a combination of six contiguous bit patterns as one code block (bits a0-a5, b0-b5, c0-c5, d0-d5, e0-e5, f0-f5, g0-g5, h0-h5, i0-i5, and j0-j5) for the 9-bit bit pattern (bits a, b, c, d, e, f, g, h, and 1) converted in the case where the input data is data and a 9-bit fixed bit pattern obtained by removing 1 bit from the 10-bit fixed bit pattern (bits a, b, c, d, e, i, f, g, h, and j) converted from the control information, a 6-bit check word is generated based on an information word composed of the 54-bit bit patterns constituting the block and a 60-bit code block in which contiguous six bits i (bits i0 to i5) are added is output from the transmitter; and, when the code block is received by the receiver, error detection and error correction are carried out based on the 54-bit information word and the 6-bit check word.

Moreover, in the present invention, if the transmission data is control information, the transmission data is converted to a 10-bit fixed bit pattern (bits a, b, c, d, e, i, f, g, h, and j) corresponding to the value indicated by the 8-bit data string, thereby ensuring the DC balance and the maximum run length of contiguous bit data; if the transmission data is data, the data is scrambled so that the running disparity of 0s and 1s of the 8-bit data string (bits A, B, C, D, E, F, G, and H) is even or substantially even and obtains the result as an 8-bit bit pattern (bits a, b, c, d, f, g, h, and j); if the 8-bit bit pattern (bits a, b, c, d, f, g, h, and j) which is the result of scrambling has the same value as the 8 bits (bits a, b, c, d, f, g, h, and j) of the 10-bit fixed bit pattern which is obtained upon conversion in the case of control information, the value of a remaining bit (bit e is taken as an inverted value of a bit (bit e) of the 10-bit fixed bit pattern; and, if the 8-bit bit pattern (bits a, b, c, d, f, g, h, and j) which is the result of scrambling does not have the same value as the 8 bits (bits a, b, c, d, f, g, h, and j) of the 10-bit fixed bit pattern which is obtained upon conversion in the case of the control information, a value of 1 is added if the number of bits whose value is 1 is 0 to 3 in the 8-bit bit pattern (bits a, b, c, d, f, g, h, and j); a value of 0 is added if the number is 5 to 8; and 1-bit data (bit e) that indicates an inverted value of an immediately previous bit (bit d or f) in a serial bit string is added if the number is 4 so as to convert to a 9-bit bit pattern (bits a, b, c, d, e, f, g, h, and j), thereby ensuring the DC balance, the maximum run length of ensured contiguous bit data, and decoding.

Other summaries of the invention of the present application will be briefly described.

In order to achieve a bit width, an operation clock, and a code rate as same as those of the 8B10B code, with making the input of an encoder (transmitter) to be 8-bit information bits and a 1-bit control bit, and the output thereof to be 10 bits, the configuration is necessary to be such that the input of the decoder (receiver) is 10 bits, and the output thereof is the 8-bit information bits and the 1-bit control bit.

While the input to the encoder is 8 bits it indicates normal data when the control bit is 0 and indicates control data when the control bit is 1. In this case, the control data is converted to a 10-bit fixed pattern upon encoding.

Desirably, the running disparity of 0s and 1s of the fixed pattern of the 10 bits is even (five 0s and five 1s), or patterns of 4:6 and 6:4 should be alternatively output. In this manner, the DC balance and limited/finite run length are ensured as for the control data.

In addition, desirably, when a serial bit string is converted to a parallel bit string on the receiver side, the 10-bit fixed patterns are configured to commonly contain a particular pattern of less than 10 bits (for example, "1100000") so that separation of every 10 bits can be easily found.

In the case where the input to the encoder is the normal data, the 8-bit data is subjected to data scrambling (i.e., scrambling), thereby generating 8-bit scramble data. Then, 1 bit additional data is added to the each 8-bit scramble data.

If more 0s are contained in the scramble data of the 8 bits, the additional data has the value of 1, and reversely, if more 1s are contained therein, the value of the additional data is 0, and if the numbers of 0s and 1s are equal to each other, the additional data has the inverted value of the value represented by the bit which is immediately before the additional data, so that the DC balance characteristics are improved, and a limited/finite run length is obtained.

The reason of this is that, while the scramble data generally cannot ensure the run length and there is a possibility that 0s or 1s are contiguous for a long period in the worst case, when the above-described additional data is inserted at an 8-bit interval, 1 is always inserted if 0s are contiguous, and 0 is always inserted if 1s are contiguous.

Also, in the present invention, the check word of n-k symbols (n-k bits) is added to an information word of k symbols (k bits) to be output so that bit errors generated with respect to the data output by the transmitter due to various factors during transmission can be subjected to error correction after reception.

More specifically, an error correction code word composed of the information word and the check word has n symbols (n bits). The check word means redundant bit data calculated from a generator polynomial of an error correction code, and is transmitted together with the information word (i.e., the data desired to be transmitted), and an error check calculation is carried out on the receiver side, so that the bit at which an error has occurred can be specified.

In the present invention, the code word is 60 bits (corresponding to 10 bits×6 cycles), and, among them, 54 bits are the information word, and 6 bits are the check word. Note that, since the error correction code (Hamming code, etc.) is generally obtained from a generator polynomial, the check word thereof has a characteristic similar to that of random numbers.

Therefore, if it is assumed that the input data is a random value, the check words per se are distributed like random numbers, thus, while the DC balance can be ensured, the limited/finite run length cannot be ensured.

According to the foregoing, since a contiguous pattern after encoding has a configuration that is separated when the 1-bit additional data is inserted to every random number of contiguous 9 bits, the contiguous number of the same value can be suppressed to 10 bits at longest for any kind of input, so that the limited/finite run length can be ensured.

Effects of the Invention

The effects obtained by typical aspects of the present invention will be briefly described below.

(1) While achieving the same bit width, operation clock, and code rate as those of an 8B10B encoding circuit, bit error correction can be enabled.

(2) Also, the code conversion that satisfies the capability of the transmission code of ensuring the DC balance and the limited/finite run length can be enabled.

BRIEF DESCRIPTIONS OF THE DRAWINGS

DESCRIPTION OF EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
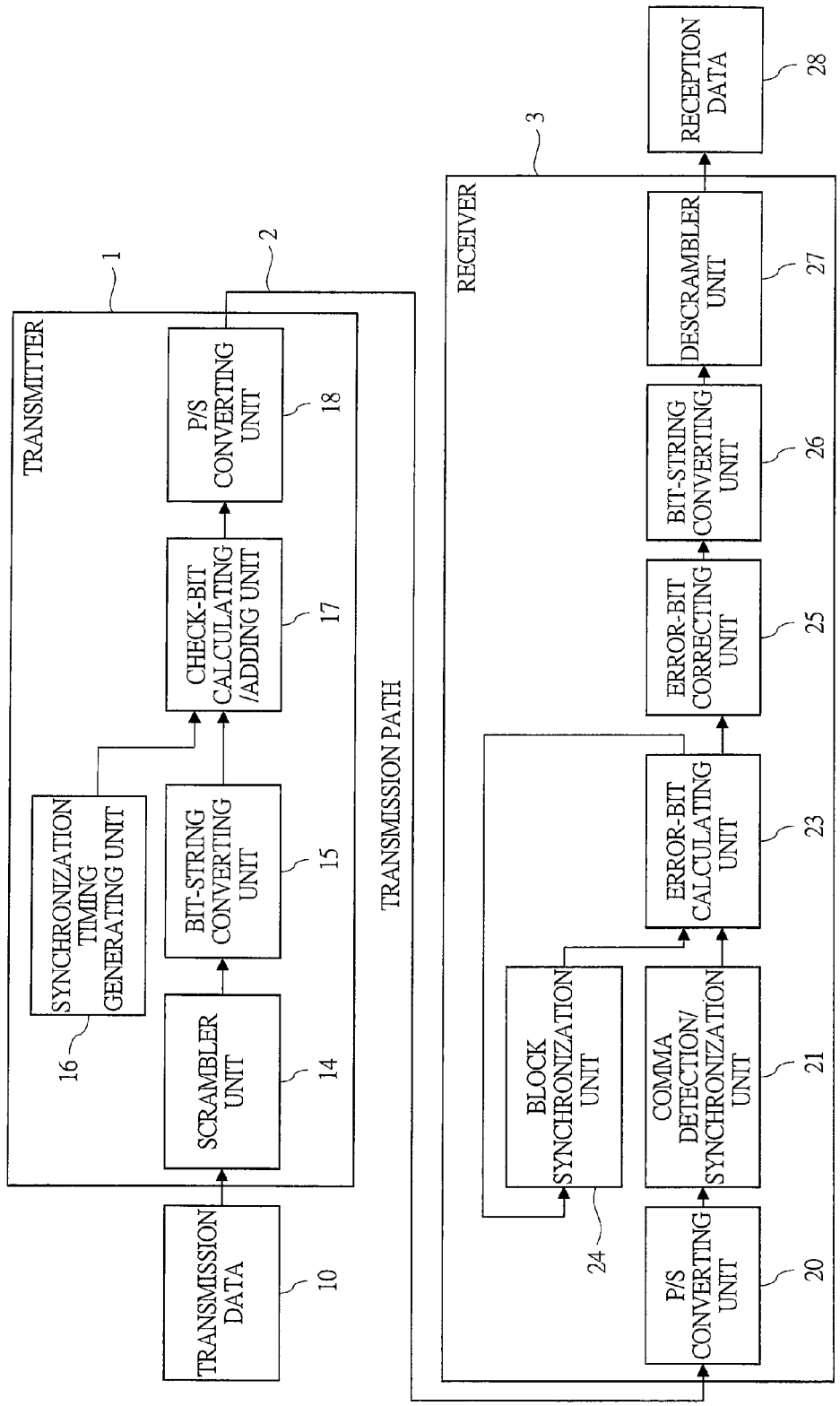
FIG. 1 is a block diagram illustrating a configuration example of data transmission equipment according to an embodiment of the present invention.

In the present embodiment, as shown in FIG. 1, data transmission equipment is composed of a transmitter 1, a transmission path 2, and a receiver 3. The transmitter 1 is connected to the receiver 3 via the transmission path 2.

Transmission data 10, which is to be transmitted, is input to the transmitter 1, then subjected to desired data conversion, and output to the transmission path 2. The receiver 3 subjects the received data to desired data conversion and then outputs the data as reception data 28. If bit errors generated in the transmission path are generated within the range of bit error correction capability, the transmission data 10 and the reception data 28 have exactly the same value.

The transmitter 1 is composed of a scrambler unit 14, a bit-string converting unit 15, a synchronization timing generating unit 16, a check-bit calculating/adding unit 17, and a P/S converting unit 18. In the transmitter 1, the transmission data 10 is input to the scrambler unit 14, and the output of the scrambler unit 14 is connected to the bit-string converting unit 15.

The output of the bit-string converting unit 15 and the output of the synchronization timing generating unit 16 are connected to the check-bit calculating/adding unit 17, the output of the check-bit calculating/adding unit 17 is connected to the P/S converting unit 18, and the output of the P/S converting unit 18 is connected to the transmission path 2.

Also, in the receiver 3, the transmission path 2 is connected to an S/P converting unit 20, and the output of the S/P converting unit 20 is connected to a byte synchronization unit 21. The outputs of the byte synchronization unit 21 and a block synchronization unit 24 are connected to an error-bit calculating unit (error-bit calculating/correcting unit 23.

The outputs of the error-bit calculating unit 23 are connected to the block synchronization unit 24 and an error-bit correcting unit (error-bit calculating/correcting unit) 25, respectively. The output of the error-bit correcting unit 25 is connected to a bit-string converting unit 26, and the output of the bit-string converting unit 26 is connected to a descrambler unit 27. Then, the descrambler unit 27 outputs the reception data 28.

The transmission data 10 is configured by valid data, which mainly constitutes data packets, etc. Meanwhile, when the transmission data 10 is stream data (continuously input data), invalid data which is input when the valid data is interrupted is also present. The invalid data herein means that "valid data is not contained", and the invalid data sometimes contains control data (control information), which is used for control of the present transmitter, receiver, and the entire system. The transmission data 10 input to the transmitter 1 according to the present invention is defined as the data which contains the valid data and a control bit for distinguishing the invalid data (i.e., control data).

The transmission data 10 is first input to the scrambler unit 14. In the scrambler unit 14, the control bit is referenced, and merely valid data (i.e., data code) is subjected to scrambling (scrambling) of bit data. If the input data is a control code, the data is output without changing the value thereof.

While the method of scrambling is not limited in the present invention, a method using a generator polynomial will be described as an example. A scrambler according to a generator polynomial (for example, $X^9+X^4+1$) scrambles and outputs an input bit string so that the probability of occurrence of 0s and 1s are ideally equal.

Generally, the DC balance of the transmission path is ensured by this scrambler. However, 0s or 1s are continuously output in some cases depending on the value input to the scrambler, and a limited/finite run length (run length of 0s and 1s are finite values) cannot be completely ensured.

In the bit-string converting unit 15, the input data is divided by an 8-bit unit, and the 8-bit data (expressed as HGFEDCBA bits) is converted to 10-bit data (expressed as abcdeifghj bits).

As described above, the input data is composed of the valid data and the control data. In the bit-string converting unit 15, in accordance with the sequence shown in FIG. 3, conversion from the 8-bit data to the 10-bit data is carried out.

Figure 3:
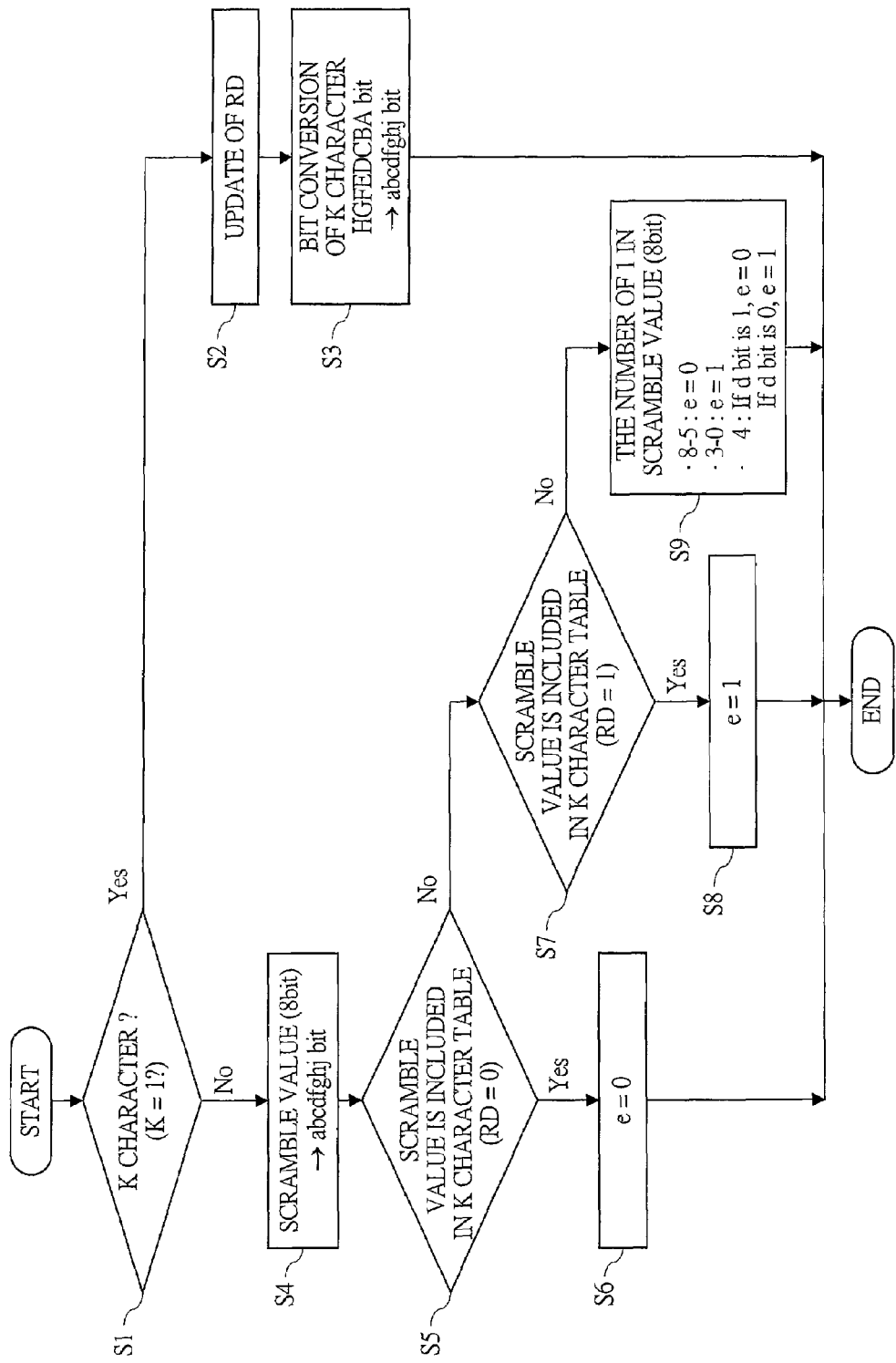
FIG. 3 is a flow chart illustrating a conversion example by the data transmission equipment of FIG. 1 from 8-bit data to 10-bit data.

In FIG. 3, first, in state S1, whether the input data is valid data or control data (i.e., K character) is determined. If the input data is control data, the process proceeds to state S2. If the input data is valid data, the process proceeds to state S4.

In state S2, the data is converted to a fixed pattern which is uniquely determined by an input 8-bit value. Although no limitation is imposed on the rules of conversion to the fixed pattern, none of the patterns after conversion are identical to one another.

Figure 2:
FIG. 2 is an explanatory diagram of a conversion table illustrating correspondence examples of bit conversion of control data which is used in the data transmission equipment of FIG. 1.

FIG. 2 is an explanatory diagram of a conversion table 40 illustrating corresponding examples of bit conversion of the control data. Herein, the conversion table 40 of FIG. 2 is the same as the conversion table of control data (in the Document, Special Character) illustrated in Patent Document 1.

The conversion table 40 shows correspondence of the 8-bit input data and 10-bit data. For example, if the input is HGFEDCBA=00011100 (binary number), the output thereof is abcdeifghj=0011110100 (if RD=0) or 1100001011 (if RD=1). RD indicates that which one of the numbers of 0s and 1s transmitted in the past is larger, wherein RD indicates that there has been more 0s if RD=0 or more 1s if RD=1.

When the DC balance is taken into consideration, the pattern that should be output this time is the pattern that includes more 1s if more 0s has been transmitted in the past or the pattern that includes more 0s if more 1s has been transmitted.

In FIG. 2, after the state S2, in state S3, the already-transmitted numbers of 0s and 1s are calculated from the converted 10-bit value and past RDs, and the value of RD is updated to RD=0 if the number of 0s is larger or updated to RD=1 if the number of 1s is larger. After state S3, the process is finished.

When the process proceeds from the state S1 to the state S4, in other words, when the data input to the bit-string converting unit 15 is the valid data (the input data is the scrambled value processed in the scrambler unit), data is output in a bit correspondence of HGFEDCBA=abcdfghj (however, which bits correspond to which bits of the 10 bits is not limited).

The bit e has a function of ensuring a limited/finite run length, which has not been completely ensured by the above-described scrambler, and adjusting short-term DC balance. In state S5, the value of the bit pattern of abcdfghj (value in which the scramble value HGFEDCBA is input) is compared with the bit patterns of RD=0 of the conversion table 40. If the same pattern is contained in the table, the process proceeds to state S6, and if the same pattern is not contained therein, the process proceeds to state S7.

In the state S6, 0 is set as the bit e, thereby causing the bit pattern (abcdefghj) after conversion to be a pattern that is different from the control data. In the state S7, the value of the bit pattern of abcdfghj (value in which the scramble value HGFEDCBA is input) is compared with the bit patterns of RD=1 of the conversion table 40. If the same pattern is contained in the table, the process proceeds to state S8, and if the same pattern is not contained therein, the process proceeds to state S9.

In the state S8, 1 is set as the bit e, thereby causing the bit pattern (abcdefghj) after conversion to be a pattern that is different from the control data. In the state S9, the number of the bits of 1 in the bit pattern of abcdfghj is counted. If the number of 1s is 0 to 3, e=1 is set; and, if the number of 1s is 5 to 8, e=0 is set.

If the number of is 4, e=0 is set if the bit d is 1, or e=1 is set if the bit d is 0. When the processes of the state S6, state S8, and state S9 are finished, the process is finished.

The operations of the states S5 to S8 have a point that the bit pattern after the conversion of the bit-string conversion of the valid data has a value different from that of the bit patterns of the control data (defined in the conversion table 40).

Since the 8-bit value (abcdfghj) output by the scrambler is a random-like pattern, the pattern same as abcdfghj of the conversion table 40 may appear. If the bit e is defined by the same operation as that of the state S9 also in the case of that pattern, the bit pattern (abcdefghj) after conversion is sometimes the same as the control data. Thus, complete decoding by the bit-string converting unit 26 of the receiver 3 becomes impossible.

Therefore, if the 8-bit value (abcdfghj) has the same pattern as abcdfghj which is defined by the conversion table 40, the inverted value of the bit e defined in the conversion table is set as the value of the bit e to be added, thereby preventing the same pattern.

In the synchronization timing generating unit 16 of FIG. 1, a timing signal using six cycles as a cycle is generated. The timing signal is used in the check-bit calculating/adding unit 17. The timing signal and the 10-bit data (abcdeifghj) output from the bit-string converting unit 15 are input to the check-bit calculating/adding unit 17, and the check-bit calculating/adding unit 17 takes the data corresponding to six cycles of the 10-bit data (abcdeifghj) as a set of code block.

Figures 4, 5:
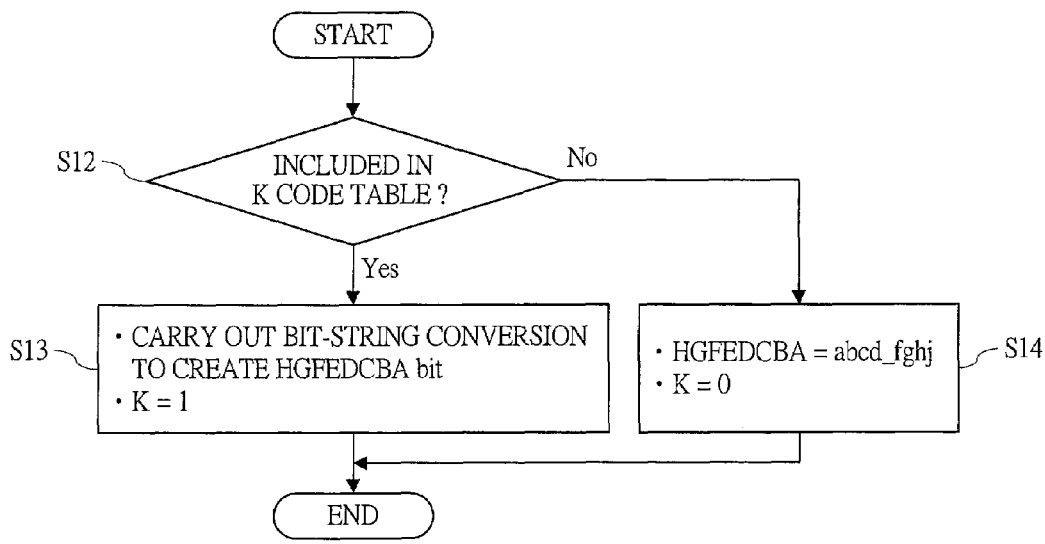
FIG. 4 is an explanatory diagram of a bit-string format of a code block by the data transmission equipment of FIG. 1.
FIG. 5 is a flow chart illustrating an example of 10-bit/8-bit conversion by the data transmission equipment of FIG. 1.

FIG. 4 is a diagram illustrating a format of the bit string of the code block.

The bit string 45 is configured by 60 bits in total composed of bits a0 to j0 of a 0th cycle, bits a1 to j1 of a 1st cycle, bits a2 to j2 of a 2nd cycle, bits a3 to j3 of a 3rd cycle, bits a4 to j4 of a 4th cycle, and bits a5 to j5 of a 5th cycle. The 10-bit data of the 0th cycle to the 5th cycle is sequentially output.

In the check-bit calculating/adding unit, check bits are added to the 10-bit data (abcdeifghj) to be output so that a bit error generated upon data transmission can be error-corrected on the receiving side.

The check bits used in the present embodiment are generated by a Hamming code which is capable of correcting a simple bit error. Herein, a (63, 57) Hamming code which is optimal to cause the encoding rate to be the same value as an 8B10B encoding circuit is used. The Hamming code has a code length of 63 bits, an information bit length of 57 bits, and a check-bit length of 6 bits.

Consequently, a 1-bit random error in 57 bits of the information bits can be corrected. However, in the present embodiment, among the 57 bits of the checkable information bits, merely 54 bits (corresponding to 9 bits×6 cycles) are used.

More specifically, in the above-described code block of 60 bits, the bits i0 to i5 which are 6 bits in total are assumed to be check bits, and the remaining 54 bits (abcdefghj of the respective cycles) are assumed to be the information bits. In the check-bit calculating/adding unit, with respect to the information bits, six-bit check bits are calculated from a generator polynomial ($X^7+X+1$) of the Hamming code, and the bits i0 to i5 are replaced by the check bits and output.

The P/S converting unit 18 converts the parallel bit data having the 10-bit width to 1-bit serial data. In this process, the 10-bit data (abcdeifghj) is output to the transmission path 2 from the bit a in the order of abcdeifghj as serial data. At this time, the serial data is transmitted to the receiver 3 by the transmission path 2.

The S/P converting unit 20 of the receiver 2 converts the received serial data to a parallel bit string which is the same as that upon transmission. The byte synchronization unit 21 detects a bit pattern, which serves as a mark to divide the data into the parallel bit data having a 10-bit width, from the parallel bit string. Although no limitation is imposed on the bit pattern of the mark, for example, the bit pattern is "0011111" contained in K28.5 in the conversion table 40 of the control data.

In the byte synchronization unit 21, when the above-described pattern is found, the position thereof is determined to be a synchronization point of 10-bit data, and the bit string following the point is output as 10-bit data (abcdeifghj) obtained by dividing based on the synchronization point.

In the error-bit calculating unit 23, the part corresponding to six cycles of the 10-bit data (abcdeifghj) input from the byte synchronization unit 21 (i.e., 60-bit data) is assumed to be one code block, and the error-bit calculating unit 23 carries out an error check based on the check bits (i0 to i5) added to the information bits and determines the position of an error bit.

The calculation method of the error check is based on the generator polynomial ($X^7+X+1$) of the Hamming code, which is a general method, and thus the explanation thereof is omitted in the present embodiment.

The error-bit calculating unit 23 outputs the 10-bit data (abcdeifghj) to the error-bit correcting unit 25 and outputs an error check result (the position of the error bit) to the block synchronization unit 24 and the error-bit correcting unit 25.

The block synchronization unit 24 generates a synchronization point (i.e., separating point of the 60-bit-interval code block) of the code block of the six cycles of the 10-bit data (abcdeifghj). The block synchronization unit 24 assumes the point having a lowest error generation rate as the synchronization point of the code block based on the error check result of every 10 bits output from the error-bit calculating unit 23 and notifies the timing of the synchronization point to the error-bit calculating unit 23.

The error-bit calculating unit 23 assumes the notified synchronization point to be a starting point of the code block and starts an error-check calculation. The error-bit correcting unit 25 receives the 10-bit data (abcdeifghj) and the error-check result (the position of the error bit) output from the error-bit calculating unit 23 and corrects the error bit indicated by the check result.

The error correction by the Hamming code is to invert the error bit, which is indicated by the check result. The error-bit correcting unit 25 outputs the error-corrected 10-bit data (abcdeifghj) to the bit-string converting unit 26.

The bit-string converting unit 26 converts the input 10-bit data (abcdeifghj) to 8-bit data (HGFEDCBA) in accordance with the sequence of 10-bit/8-bit conversion illustrated in FIG. 5.

In this conversion, first, whether the 10-bit data (abcdeifghj) is contained in the bit strings B of the conversion table 40 or not is determined in state S12. If the 10-bit data is contained therein, the process proceeds to state S13; and, if the 10-bit data is not contained therein, the process proceeds to state S14.

In the state S13, in accordance with the conversion table 40, the 9-bit data (abcdefghj) of the 10-bit data (abcdeifghj) of the bit string B except the bit i is converted to the 8-bit data (HGFEDCBA) of the bit string A.

The 8-bit data (HGFEDCBA) converted in the state S13 is assumed to be control data and output to the descrambler unit 27. In the state S14, the bits abcdfghj of the 10-bit data (abcdeifghj) are assumed to be 8-bit data (HGFEDCBA) without change, also assuming the same to be valid data, and output to the descrambler unit 27.

In the descramble unit 27, with reference to the control bit, only valid data (i.e., data code) is subjected to reproduction (descrambling) of scrambled data. If the input data is a control code, the data is output without changing the value thereof.

In the descrambling, a generator polynomial (for example, $X^9+X^4+1$) which is the same as that used upon scrambling is used. Eventually, the reception data 28 output from the descrambler unit 27 (i.e., the receiver 3) has the same value as the transmission data 10 to be originally transmitted by the transmitter 1.

However, the reception data has the same value only when the bit error generated in the transmission path 2 is within the range of the correction capability of the used error correction function (in the present embodiment, an error of one bit among the 60 bits).

Thus, according to the present embodiment, while achieving the same bit width, operation clock, and code rate as the 8B10B encoding circuit, code conversion which enables bit-error correction and satisfies the original capability of a transmission code such as ensuring the DC balance and limited/finite run length can be carried out.

While the invention made by the inventors of the present invention has been concretely described based on the embodiments in the foregoing, it is needless to say that the present invention is not limited to the foregoing embodiments and various modifications and alterations can be made within the scope of the present invention.

INDUSTRIAL APPLICABILITY

The present invention pertains to communication interfaces and data transmission circuits using high-speed serial interfaces and suitable for communication interfaces of network devices (routers, switches, transmission devices, media converters, repeaters, gateways, etc.), personal computers, servers, large scale calculators, disk array systems, network attached storage (NAS), etc. and for all equipment which has a data transmission path in the equipment.

The invention claimed is:

1. Data transmission equipment converting transmission data, which comprises data and control information, to serial bit string data and transmitting the converted data, the data transmission equipment comprising a transmitter and a receiver connected to each other by a transmission path, wherein the transmitter includes:

a scrambler unit which ensures a DC balance by scrambling data so that a running disparity of 0s and 1s of input data is substantially even;

a bit-string converting unit which adds bit data, which ensures a maximum run length of a serial bit string of scrambled data, and converts control information to bit data of a certain fixed value;

a synchronization timing generating unit which divides transmission data by a constant interval and converts the transmission data to a data block; and a check-bit calculating and adding unit which calculates check data for an error correction with respect to the data block and adds the check data to part of the data block, and the receiver includes:

an error-bit calculating/correcting unit which receives the data block, and carries out an error check and an error correction based on the check bits added to the data block;

a bit-string converting unit which extracts a fixed-value bit pattern of the control data from the bit string of the data block, converts the bit pattern to control information, and discriminates the data and the control information; and a descrambler unit which reconverts data-scrambled data to data before scrambling, wherein the transmission data to be input to the transmitter includes:

an 8-bit bit data string; and a control bit indicating that the 8-bit data is either the data or the control information, the scrambler unit, if the transmission data is the data, scrambles the data so that a running disparity of 0s and 1s of the 8-bit bit data string is even or substantially even and obtains the result as an 8-bit bit pattern, the bit-string converting unit adds: a value of 1 if the number of bits whose value is 1 is 0 to 3 in the 8-bit bit pattern; a value of 0 if the number is 5 to 8; and 1-bit data that indicates an inverted value of an immediately previous bit in a serial bit string if the number is 4 so as to convert to a 9-bit bit pattern, thereby ensuring the DC balance and the maximum run length of ensured contiguous bit data, and, if the transmission data is the control data, the bit-string converting unit converts to a 10-bit fixed bit pattern corresponding to a value represented by the 8-bit data string, thereby ensuring the DC balance and the maximum run length of the contiguous bit data.

2. The data transmission equipment according to claim 1, wherein, the check-bit calculating and adding unit, with taking a combination of six contiguous bit patterns as one code block for a 9-bit bit pattern converted from data and a 9-bit fixed bit pattern obtained by removing 1 bit from a 10-bit fixed bit pattern converted from control information, generates a 6-bit check word based on an information word composed of the 54-bit bit patterns constituting the block, and outputs a 60-bit code block in which contiguous six bits 'i' are added, the error-bit calculating unit receives the code block and carries out an error detection based on the 54-bit information word and the 6-bit check word, and the error-bit correcting unit corrects an error detected by the error-bit calculating unit.

3. The data transmission equipment according to claim 1, wherein the transmission data to be input to the transmitter is composed of:

an 8-bit bit data string; and a control bit indicating that the 8-bit data is either the data or the control information, the scrambler unit, if the transmission data is the control information, converts the transmission data to a 10-bit fixed bit pattern corresponding to the value indicated by an 8-bit data string, thereby ensuring the DC balance and the maximum run length of contiguous bit data, and, if transmission data is the data, the scrambler unit scrambles the data so that a running disparity of 0s and 1 s of the 8-bit data string is even or substantially even and obtains the result as an 8-bit bit pattern;

the bit-string converting unit, if the 8-bit bit pattern which is the result of scrambling has the same value as 8 bits of a 10-bit fixed bit pattern which is obtained upon conversion in the case of the control information, takes a value of a remaining bit 'e' as an inverted value of a bit 'e' of the 10-bit fixed bit pattern, and, if the 8-bit bit pattern which is the result of scrambling does not have the same value as 8 bits of a 10-bit fixed bit pattern which is obtained upon conversion in the case of the control information, the bit-string converting unit adds: a value of 1 if the number of bits whose value is 1 is 0 to 3 in the 8-bit bit pattern; a value of 0 if the number is 5 to 8;

and 1-bit data that indicates an inverted value of an immediately previous bit in a serial bit string if the number is 4 so as to convert to a 9-bit bit pattern, thereby ensuring the DC balance, the maximum run length of ensured contiguous bit data, and decoding.

4. A generating method for a transmission code for converting transmission data to serial bit string data and transmitting by a transmitter and a receiver connected by a transmission path, wherein the transmission data to be input to the transmitter is composed of an 8-bit bit data string and a control bit indicating that the 8-bit data is either normal data or control data, if the transmission data is the data, the data is scrambled so that the running disparity of 0s and 1 s of the 8-bit bit data string is even or substantially even and the result is obtained as an 8-bit bit pattern, and, a value of 1 is added if the number of bits whose value is 1 is 0 to 3 in the 8-bit bit pattern; a value of 0 is added if the number is 5 to 8; and 1-bit data that indicates an inverted value of an immediately previous bit (bit d or f) in a serial bit string is added if the number is 4 so as to convert to a 9-bit bit pattern, thereby ensuring the DC balance and the maximum run length of ensured contiguous bit data, and, if the transmission data is the control data, the bit-string converting unit converts to a 10-bit fixed bit pattern corresponding to a value represented by a 8-bit data string, thereby ensuring the DC balance and the maximum run length of the contiguous bit data.

5. The generating method for a transmission code according to claim 4, wherein, with taking a combination of six contiguous bit patterns as one code block for 9-bit bit pattern converted in the case where transmission data is the data and a 9-bit fixed bit pattern obtained by removing 1 bit from a 10-bit fixed bit pattern converted from control information, a 6-bit check word is generated based on an information word composed of 54-bit bit patterns constituting the block and a 60-bit code block in which contiguous six bits 'i' are added is output from the transmitter, and, when the receiver receives a code block, an error detection and an error correction are carried out based on the 54-bit information word and the 6-bit check word.

6. The generating method for a transmission code according to claim 4, wherein, if the transmission data is the control information, the transmission data is converted to a 10-bit fixed bit pattern corresponding to a value indicated by a 8-bit data string, thereby ensuring the DC balance and the maximum run length of contiguous bit data, if the transmission data is the data, the data is scrambled so that a running disparity of 0s and 1s of the 8-bit data string is even or substantially even and obtains the result as an 8-bit bit pattern, if the 8-bit bit pattern which is the result of scrambling has the same value as 8 bits of a 10-bit fixed bit pattern which is obtained upon conversion in the case of control information, the value of a remaining bit is taken as an inverted value of a bit of the 10-bit fixed bit pattern, and, if the 8-bit bit pattern which is the result of scrambling does not have the same value as 8 bits of the 10-bit fixed bit pattern which is obtained upon conversion in the case of the control information, a value of 1 is added if the number of bits whose value is 1 is 0 to 3 in the 8-bit bit pattern; a value of 0 is added if the number is 5 to 8; and 1-bit data (bit e) that indicates an inverted value of an immediately previous bit in a serial bit string is added if the number is 4 so as to convert to a 9-bit bit pattern, thereby ensuring the DC balance, the maximum run length of ensured contiguous bit data, and decoding.

* * * * *